(12) United States Patent
Xia et al.

(10) Patent No.: US 12,130,407 B2
(45) Date of Patent: Oct. 29, 2024

(54) SYSTEM AND METHOD FOR PARALLEL TWO-PHOTON LITHOGRAPHY USING A METALENS ARRAY

(71) Applicant: Lawrence Livermore National Security, LLC, Livermore, CA (US)

(72) Inventors: Xiaoxing Xia, Pleasanton, CA (US); Eyal Feigenbaum, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 925 days.

(21) Appl. No.: 17/168,743

(22) Filed: Feb. 5, 2021

(65) Prior Publication Data

US 2022/0252761 A1    Aug. 11, 2022

(51) Int. Cl.
*G02B 1/00* (2006.01)
*G03F 7/00* (2006.01)

(52) U.S. Cl.
CPC ........... *G02B 1/002* (2013.01); *G03F 7/0037* (2013.01); *G03F 7/70275* (2013.01); *G02B 2207/101* (2013.01)

(58) Field of Classification Search
CPC .. G02B 1/0002; G03F 7/0037; G03F 7/70275
USPC ....................................................... 359/629
See application file for complete search history.

(56) References Cited

U.S. PATENT DOCUMENTS

| | | |
|---|---|---|
| 8,986,563 B2 | 3/2015 | Thiel et al. |
| 9,492,969 B2 | 11/2016 | Spadaccini et al. |
| 9,507,064 B2 | 11/2016 | Brongersma et al. |
| 10,408,419 B2 | 9/2019 | Aieta et al. |

(Continued)

FOREIGN PATENT DOCUMENTS

| | | | |
|---|---|---|---|
| DE | 102011105679 A1 | 12/2012 | |
| WO | WO-2017176921 A1 | 10/2017 | |
| WO | WO-2020242384 A1 * | 12/2020 | .............. G01J 5/024 |

OTHER PUBLICATIONS

International Search Report and Written Opinion regarding International Patent Application No. PCT/US2022/014862, dated May 10, 2022.

(Continued)

*Primary Examiner* — Jerry L Brooks
(74) *Attorney, Agent, or Firm* — HARNESS, DICKEY & PIERCE, P.L.C.

(57) ABSTRACT

A metalens array is disclosed for controllably modifying a phase of a wavefront of an optical beam. The metalens array may have a substrate having at least first and second metalens unit cells, and forming a single integrated structure with no stitching being required of the first and second metalens unit cells. The first metalens unit cell has a first plurality of nanoscale features and is configured to modify a phase of a first portion of a wavefront of an optical signal incident thereon in accordance with a first predetermined phase pattern to create at least one first focal voxel within an image plane. The second metalens unit cell has a second plurality of nanoscale features configured to modify the phase of a second portion of the wavefront of the optical signal incident thereon, in accordance with a second predetermined phase pattern, to simultaneously create at least one second focal voxel within the image plane. Each metalens unit cell also has an overall diameter of no more than about 200 microns.

20 Claims, 9 Drawing Sheets

(56) References Cited

U.S. PATENT DOCUMENTS

| | | |
|---|---|---|
| 10,481,328 B1 | 11/2019 | Krueger et al. |
| 2016/0303797 A1 | 10/2016 | Moran |
| 2016/0306079 A1 | 10/2016 | Arbabi et al. |
| 2017/0045652 A1 | 2/2017 | Arbabi et al. |
| 2019/0126537 A1 | 5/2019 | Saha et al. |
| 2019/0173191 A1 | 6/2019 | Kamali et al. |
| 2020/0348500 A1 | 11/2020 | Kwon et al. |

OTHER PUBLICATIONS

Formanek, F., et al. Three-dimensional fabrication of metallic nanostructures over large areas by two-photon polymerization. Optics express, 14(2), 800-809 (2006).

Yang, L., et al. Parallel direct laser writing of micro-optical and photonic structures using spatial light modulator. Optics and Lasers in Engineering, 70, 26-32 (2015).

Geng, Q., Wang, D., Chen, P., & Chen, S. C. Ultrafast multi-focus 3-D nano-fabrication based on two-photon polymerization. Nature communications, 10, 2179 (2019).

Hilbert, F., et al. Impact of massive parallelization on two-photon absorption micro-and nanofabrication. Proc. SPIE 11271, Laser 3D Manufacturing VII, 1127105 (2020).

Phan, T. et al. High-efficiency, large area, topology-optimized metasurfaces. Light: Sciences & Applications, 8, 48 (2019).

Jiang, J. et al. Global Optimization of dielectric metasurfaces using a physics-driven neural network. Nano Letters, 19(8), 5366 (2019).

\* cited by examiner

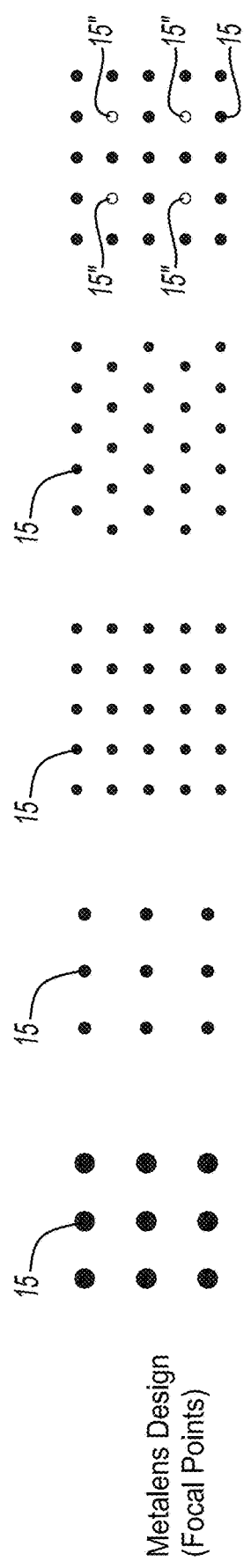
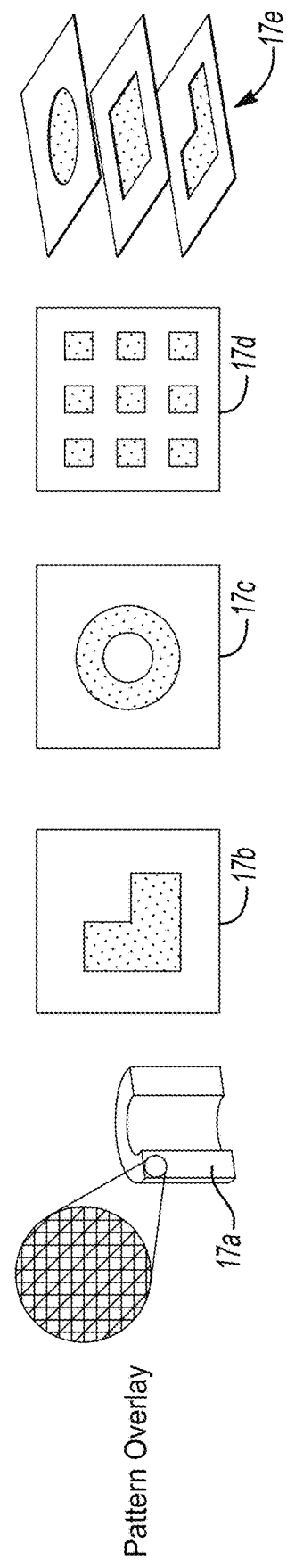

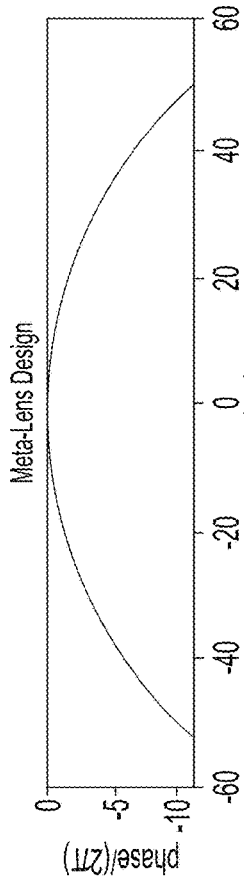
FIGURE 13c1
PRIOR ART
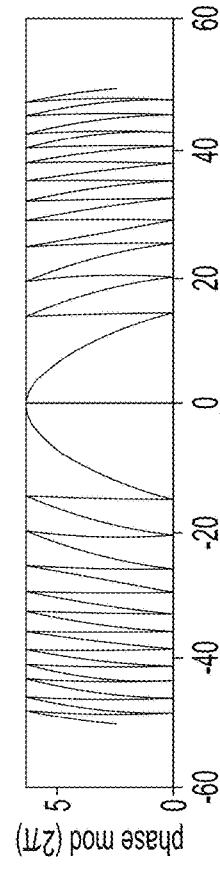
FIGURE 13c2
PRIOR ART
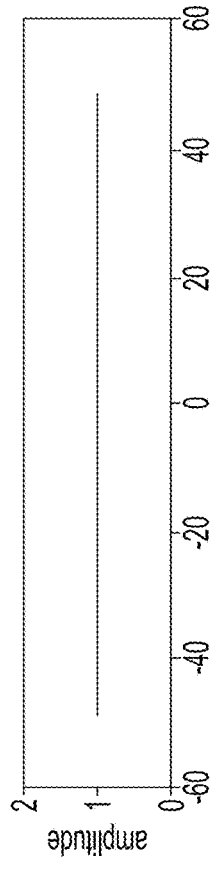
FIGURE 13c3
PRIOR ART
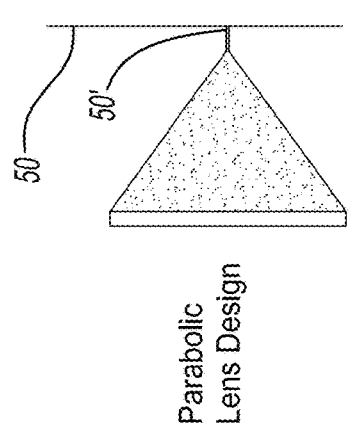
FIGURE 13a
PRIOR ART
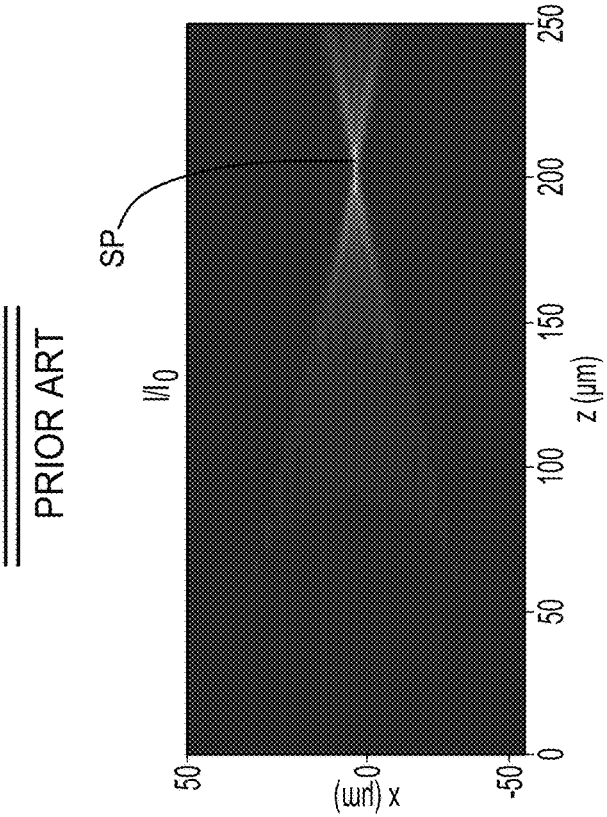
FIGURE 13b
PRIOR ART

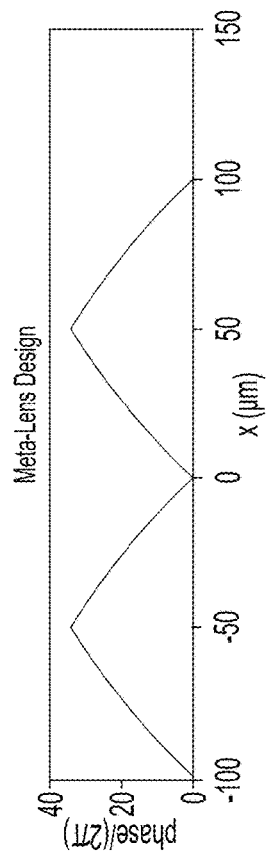
FIGURE 14c1
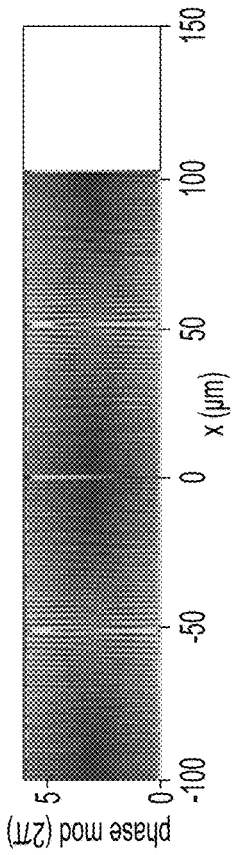
FIGURE 14c2
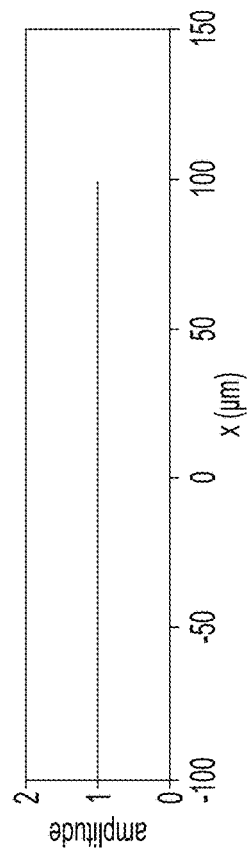
FIGURE 14c3
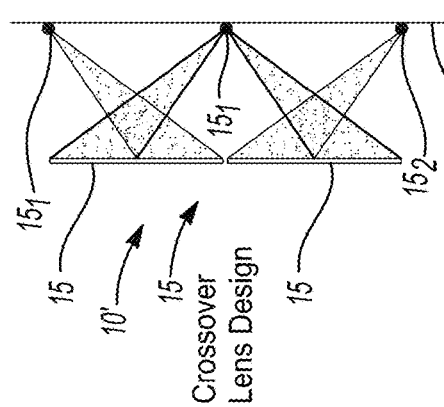
FIGURE 14a
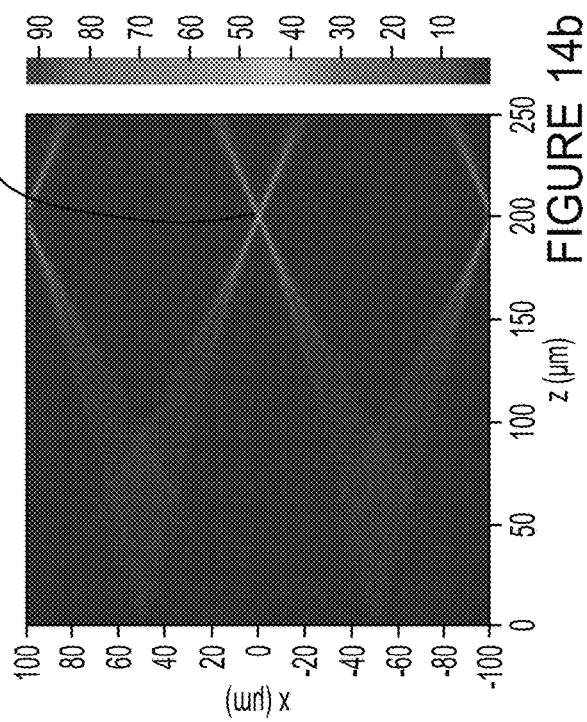
FIGURE 14b

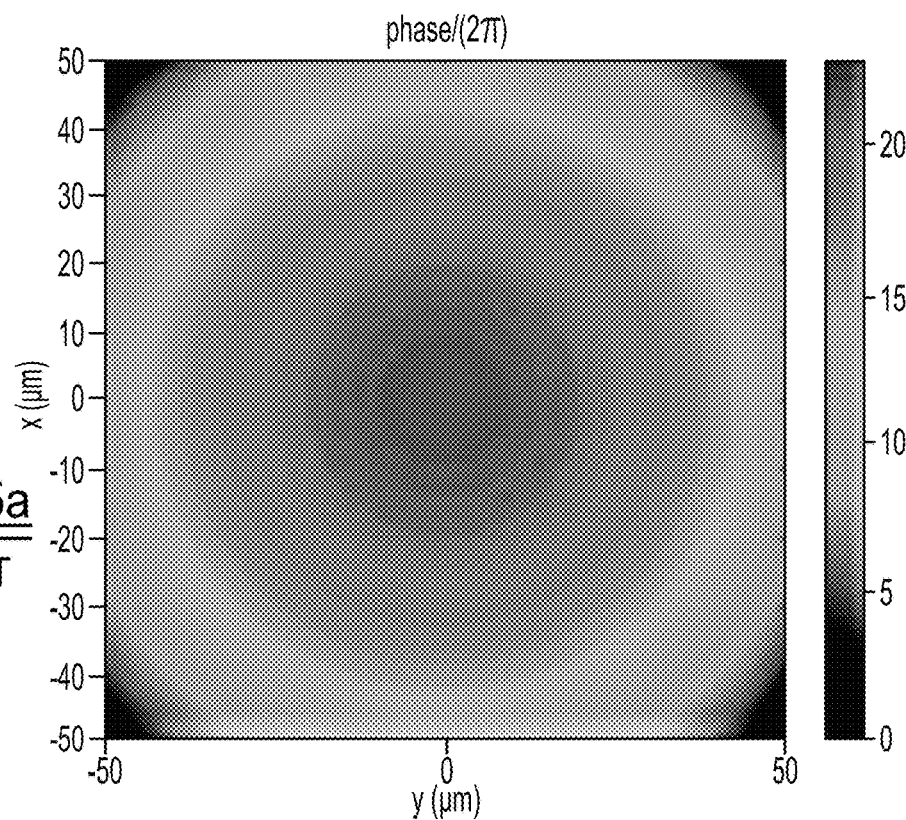
FIGURE 15a
PRIOR ART
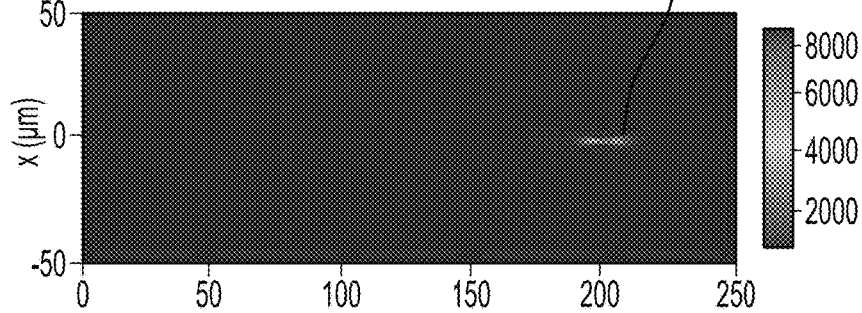
FIGURE 15b1
PRIOR ART
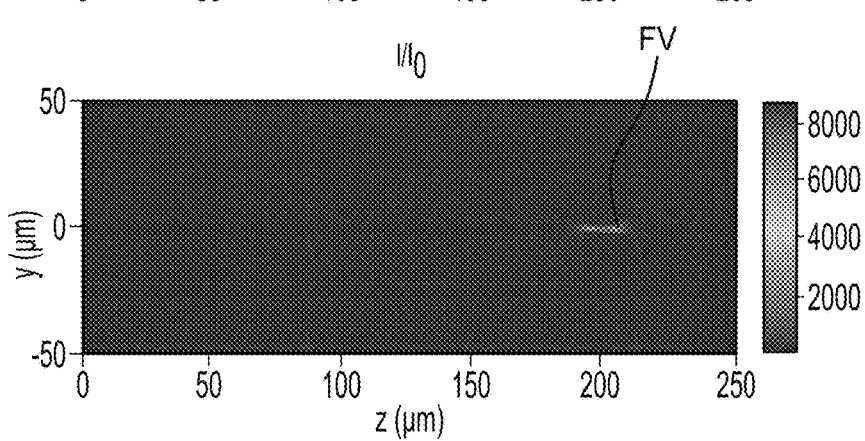
FIGURE 15b2
PRIOR ART

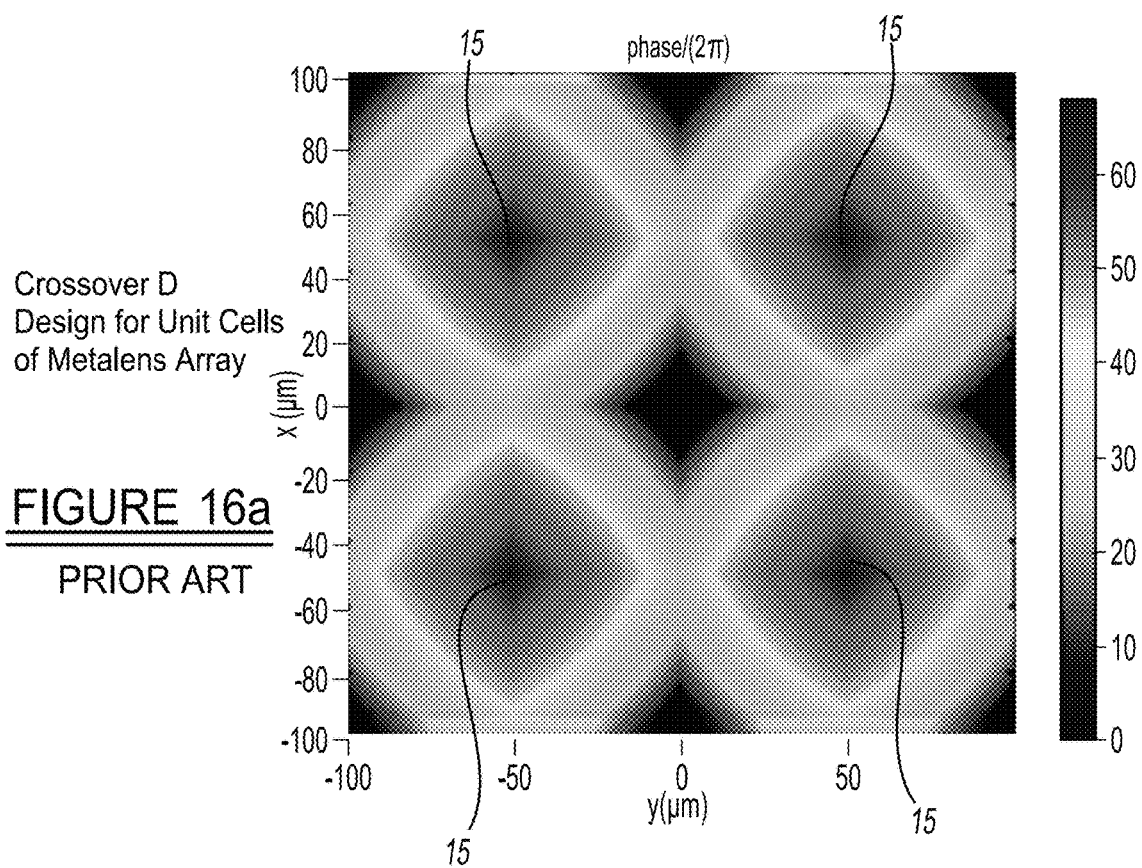
FIGURE 16a
PRIOR ART
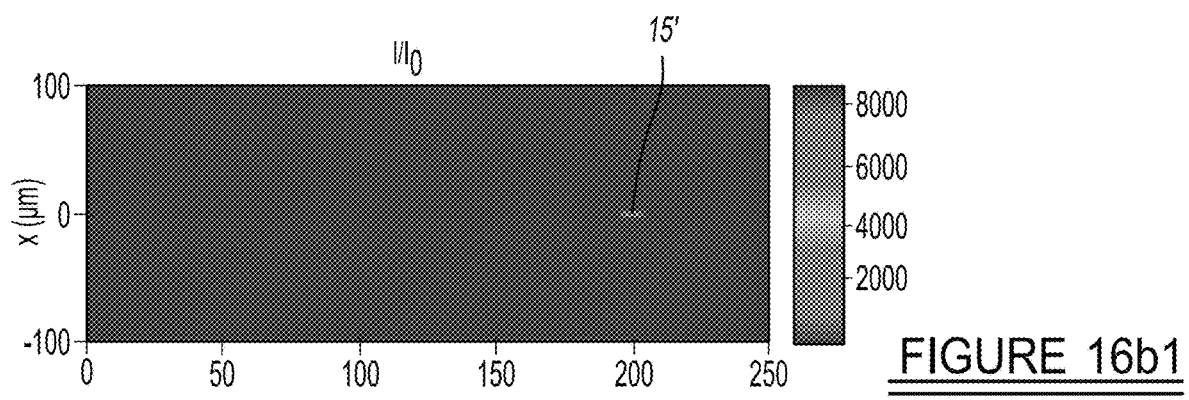
FIGURE 16b1
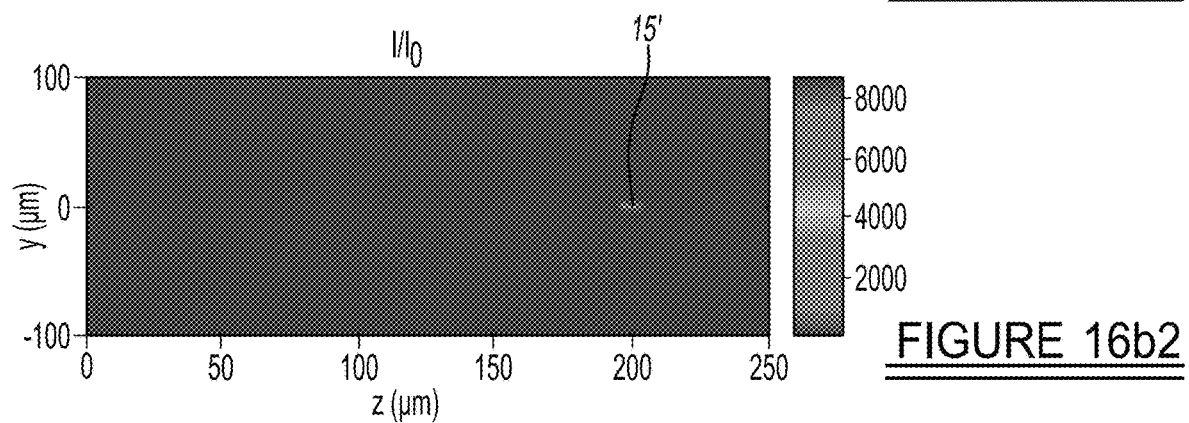
FIGURE 16b2

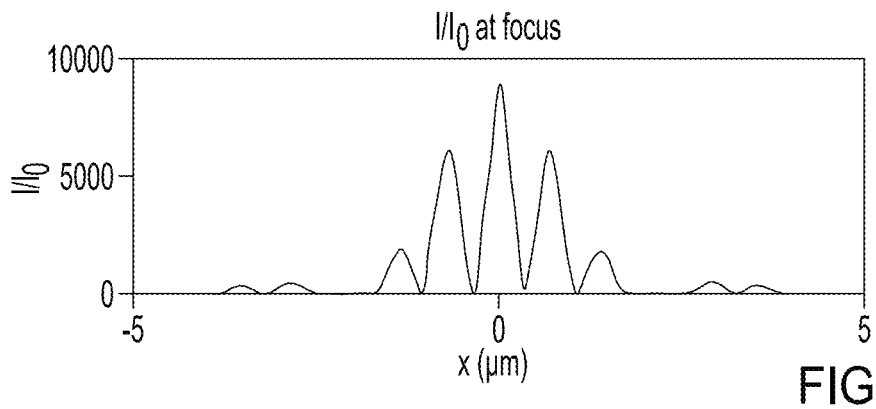
FIGURE 16c1
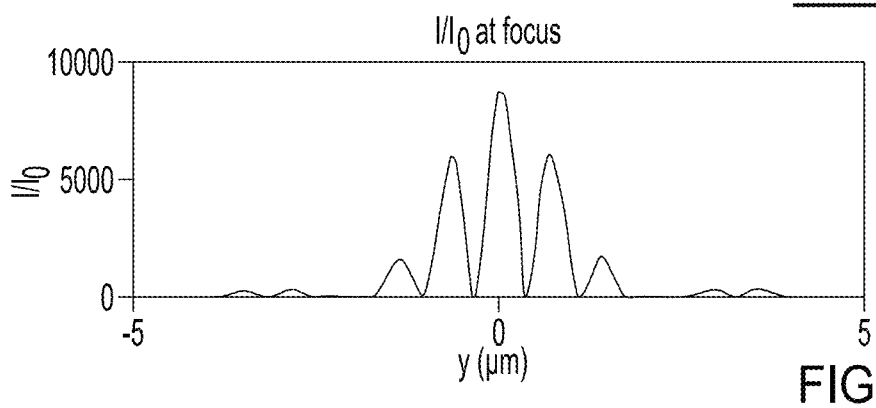
FIGURE 16c2
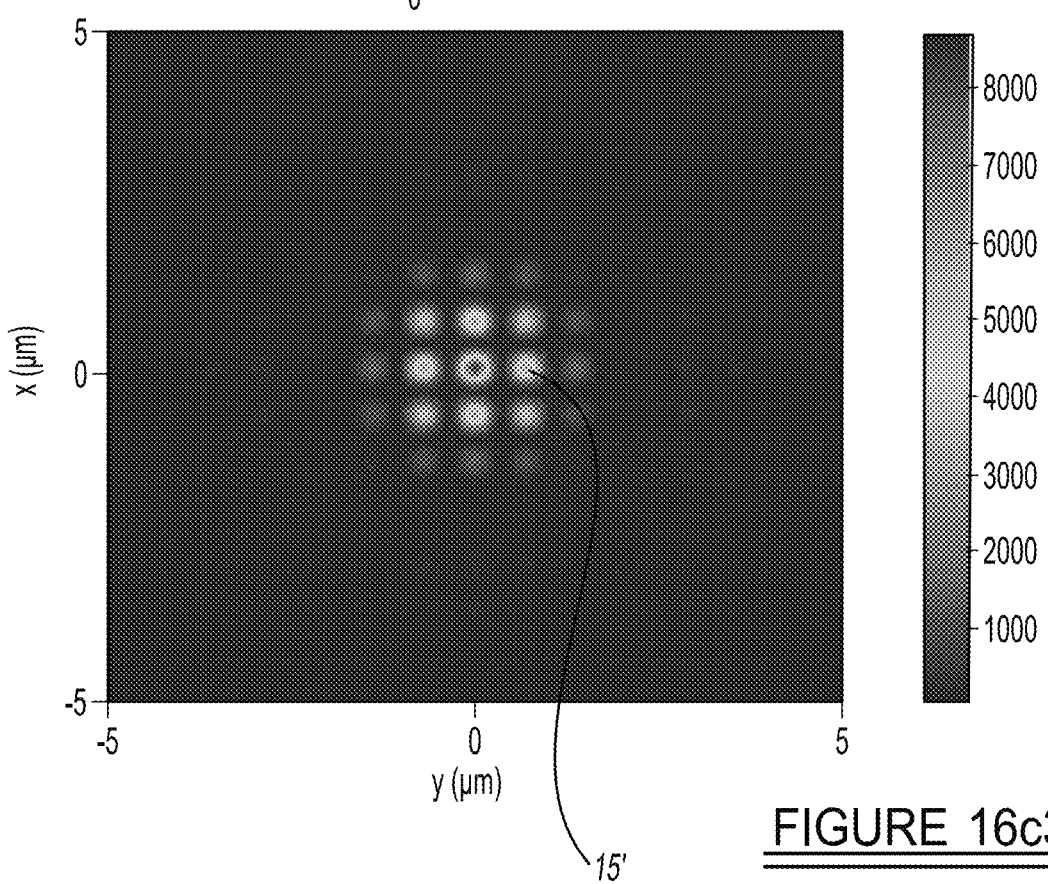
FIGURE 16c3

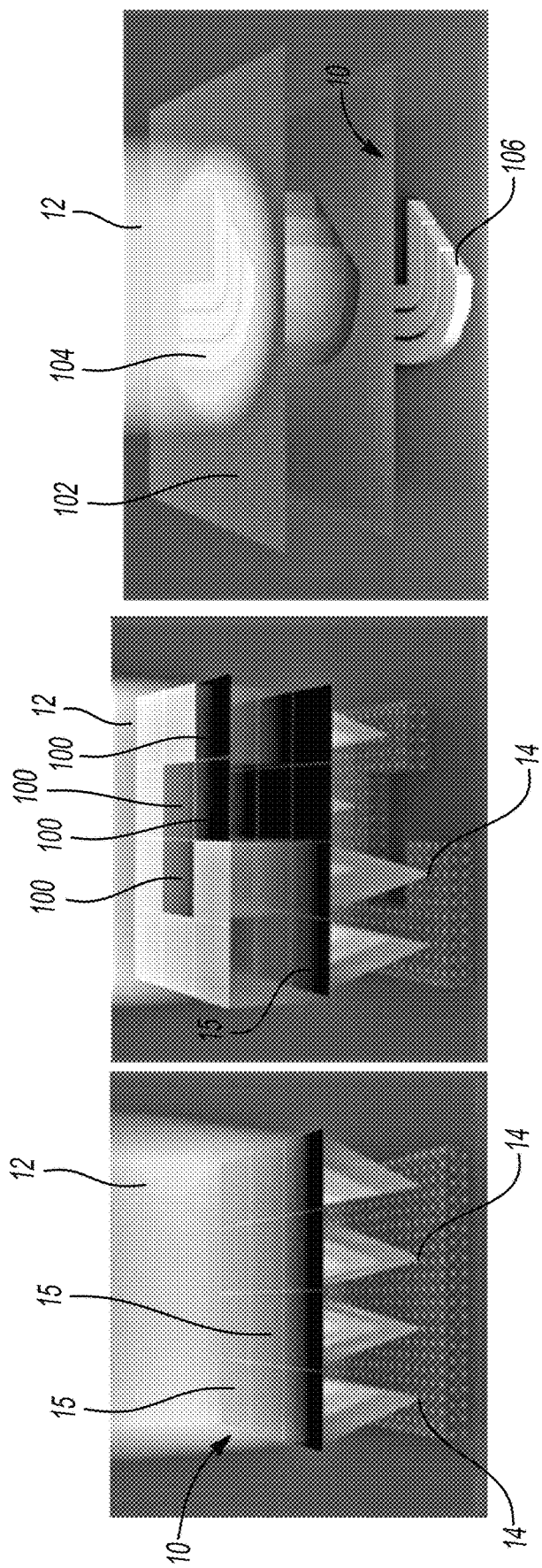

SYSTEM AND METHOD FOR PARALLEL TWO-PHOTON LITHOGRAPHY USING A METALENS ARRAY

STATEMENT OF GOVERNMENT RIGHTS

The United States Government has rights in this invention pursuant to Contract No. DE-AC52-07NA27344 between the U.S. Department of Energy and Lawrence Livermore National Security, LLC, for the operation of Lawrence Livermore National Laboratory.

FIELD

The present disclosure relates to two-photon lithography, and more particularly to embodiments of a metalens or metasurface array to parallelize two-photon lithography to achieve improved high-resolution, large scale 3D printing.

BACKGROUND

The statements in this section merely provide background information related to the present disclosure and may not constitute prior art.

State-of-the-art two-photon lithography, for example as described in U.S. Pat. No. 8,986,563 to Thiel et al., uses a high numerical aperture (NA) objective to focus a femtosecond laser beam with a wavelength of A into a voxel inside a photoresist sensitive to light with a wavelength of ~λ/2. The voxel represents a confined space from about 100 nm, or slightly less, up to a few microns in size. The laser intensity is sufficiently high to induce two-photon polymerization, and by moving the photoresist-loaded substrate with respect to the objective, 3D structures can be printed in a "Direct Laser Writing" fashion. Such two-photon lithography method (termed "serial two-photon lithography") can produce polymer structures with submicron resolution, but the printing speed is extremely slow.

Recent work at Lawrence Livermore National Laboratory, as embodied in U.S. 2019/0126537 to Saha et al., has involved using a Digital Mirror Device (DMD) and temporal focusing optics to project and crosslink DMD-patterned light sheets through two-photon polymerization. The teachings of U.S. 2019/0126537 are hereby incorporated by reference into the present disclosure. This projection two-photon lithography method eliminates the need to raster scan the laser focal voxel in the X-Y plane by directly projecting a DMD-modulated image at the image plane of the high numerical aperture (NA) objective, which gives rise to an increased printing speed. Similar to previous two-photon polymerization techniques, the focal plane of the projected light sheet is inside the photoresist, and its thickness is controlled by the temporal focusing optics and the two-photon absorption process. 3D printing is achieved by changing the distance between the photoresist-loaded substrate (in Z direction) and polymerizing different projected patterns at each Z position in a layer-by-layer fashion.

Other scientific journal publications describe various multi-foci two-photon lithography which can polymerize the photoresist at more than one laser focal voxel simultaneously. These different approaches utilize a microlens array, a spatial light modulator, a DMD, or a diffractive optical element to create the multi-focus pattern. All use high NA objectives as the final step to project the multiple focal voxels into the photoresist to induce two-photon polymerization.

Still another method for high-resolution 3D printing is a technique referred to as "micro-stereolithography", which is described in U.S. Pat. No. 9,492,969 to Spadaccini et al., and which is based on single photon absorption. The teachings of U.S. Pat. No. 9,492,969 are hereby incorporated by reference into the present disclosure. This technique uses a digital light projector to project light with a selected wavelength to a resin bath, where the resin can be polymerized by the light. Because of the single photon absorption mechanism instead of two-photon absorption, the light intensity is not confined to the focal plane in the direction of the projection (which is defined as the Z direction in the present disclosure). As such, the majority of the resin between the projected image and the sample substrate will be polymerized. The thickness of the polymerized pattern during each projection is controlled mechanically by the spacing between the projected image and the substrate or the previously printed structure. By changing this spacing and then projecting another image iteratively, a 3D structure can be printed in a layer-by-layer fashion. Demagnifying optics can be used to improve the printing resolution to some degree by shrinking the projected image. Some approaches have used a scanning galvo mirror to move and stitch projected patterns laterally to increase the printing area. Nevertheless, micro-stereolithography still provides a resolution that is significantly less than most two-photon lithography methods due to the single photon absorption mechanism.

Metalenses and metasurfaces are known structures which generally consist of a specific arrangement of subwavelength nanoscale features deposited on a substrate. At different locations of the metasurface, the nanoscale features are designed to locally modify the phase, amplitude and polarization of the incoming light passing through or reflected by the metasurface. The collective of all the nanoscale features on the metasurface works in a concerted way to enable certain functionalities, such as engineering the optical wave front. A metalens is a kind of metasurface that focuses or disperse light in a way similar to refractive lenses.

Other known work, such as disclosed in U.S. 2019/0173191 to Kamali et al., involves the use of cascaded metasurfaces to shape a light beam in 3D. The resulting holographic intensity profile can induce single-photon photopolymerization where the intensity is high, and thus create certain 3D structures such as diamond or gyroid structures.

All of the foregoing approaches certain benefits, but the use of these approaches is still time consuming from a manufacturing standpoint. Accordingly, a new approach which enables significantly reduced manufacturing time for a 3D printed component would be highly useful and enable 3D parts to be made even more economically.

SUMMARY

This section provides a general summary of the disclosure, and is not a comprehensive disclosure of its full scope or all of its features.

In one aspect the present disclosure relates to a metalens array apparatus for controllably modifying a wavefront of an optical beam. The apparatus may comprise a first metalens unit cell having a first plurality of nanoscale features, the first metalens unit cell configured to modify a first portion of a wavefront of an optical signal in accordance with a first predetermined phase pattern to create a first focal voxel within an image plane. A second metalens unit cell is included which has a second plurality of nanoscale features, and is formed adjacent to the first metalens unit cell. The second metalens unit cell is configured to receive and modify a second portion of the wavefront of the optical signal, in accordance with a second predetermined phase pattern, to create a second focal voxel within the image plane. The first and second metalens unit cells are further configured to simultaneously receive portions of the optical beam to enable simultaneously projecting the first and second focal voxels within the image plane.

In another aspect the present disclosure relates to a metalens array for use in two-photon lithography, for controllably modifying a wavefront of an optical beam being used to activate a photoresist, the photoresist being used to form a 3D part in a printing operation. The apparatus may comprise a substrate and a plurality of metalens unit cells arranged in a contiguous planar grid on the substrate. Each metalens unit cell may include a plurality of nanoscale features formed on the substrate. The nanoscale features modify a portion of a wavefront of an optical beam incident upon an upper surface of the metalens unit cells in a predetermined manner. This causes each metalens unit cell to generate at least one focal voxel within its area defined, and further such that the at least one focal voxel is generated within a planar focal plane within which the photoresist is present. In addition, the metalens unit cells create their respective focal voxels simultaneously within the focal plane using the optical beam.

In another aspect the present disclosure relates to a method of forming a metalens array which is able to controllably modify a wavefront of an optical beam incident thereon. The method may comprise forming a plurality of unit cells on a portion of a planar substrate material, which collectively configure the metalens array to form a periodic structure. The method may further include further forming each one of the plurality of unit cells such that the unit cells are arranged contiguously to one another in a grid pattern. The method may further include forming each one of the plurality of unit cells such that each is able to modify a portion of the wavefront of the optical beam, and such that each unit cell simultaneously creates a focal voxel within an image plane.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings, in which:

FIGS. 7a-7e illustrate plan views of different sized, spaced and configured focal voxels that may be created using different embodiments of the metalens array of the present disclosure;

FIGS. 8-12 are illustrations of different light blocking patterns or "mask" overlays that may be used with the 3D printed micro/nano-structures of a given metalens array to achieve a degree of macroscopic light-blocking, to further limit the area of two-photon polymerization;

FIG. 13a is a side view of a prior art parabolic lens design showing the single focal voxel that it forms on a focal plane, with FIG. 13b showing a simulated intensity profile illustrating the length of the focal voxel, and FIGS. 13c1-13c3 show a representative profile or curvature of the parabolic lens of FIG. 13a (FIG. 13c1), a wrapped phase profile within the range of zero to 27 of the signal used to create the simulation (FIG. 13c2) and an input intensity of the signal used to create the simulation (FIG. 13c3);

FIG. 14a is a side view of a crossover lens embodiment of the metalens array of the present disclosure which incorporates two unit cells, and where the two unit cells each focus the incoming beam to two focal voxels on a focal plane at locations such that the focal voxels overlap with the focal voxels of laterally adjacent unit cells, and where FIG. 14b shows a simulation illustrating how the length of the focal voxel has been significantly reduced along the Z axis to form a more circular focal voxel, and FIGS. 14c1-14c3 show one example of a profile of the metalens unit cells of FIG. 14a (FIG. 14c1), a wrapped phase profile of the signal used to create the simulation (FIG. 14c2) and an input intensity of the signal used to create the simulation (FIG. 14c3);

FIG. 15a shows a phase profile of the prior art parabolic lens, which is used as the input of a simulation; and FIGS. 15b1 and 15b2 show the resulting intensity profiles in the X-Z and Y-Z planes, respectively;

FIG. 16a shows an intensity profile of a signal produced using the crossover design of a metalens array of the present disclosure, and where FIGS. 16b1 and 16b2 show phase profiles resulting from the simulation shown in FIG. 16a in the X-Z plane (FIG. 16b1) and in the Y-Z plane (FIG. 16b2); and wherein FIGS. 16c1 and 16c2 are the resulting intensity profiles in along and X and the Y axis at the focal distance in Z, and FIG. 16c3 shows a simulated intensity distribution in the X-Y plane of the focal voxel at the focal distance in Z; and FIGS. 17a-17c show simulations to explain how pairing of each metalens unit cell with a pixel in a spatial light modulator enables 3D printing of periodic structures with defined exterior boundaries and non-periodic structures.

DETAILED DESCRIPTION

Example embodiments will now be described more fully with reference to the accompanying drawings.

The present disclosure involves new apparatus and methods to create and construct a metalens array or other forms of optical metasurfaces for use in a wide array of technical and manufacturing applications. The embodiments of the present disclosure have particular utility when used in connection with two-photon lithography applications. The various embodiments of the present disclosure enable high-resolution, large-scale, highly parallel two-photon lithography to be performed.

Various embodiments of the present disclosure use an array of focusing metalenses to split an incoming optical beam, such as a laser beam, into an array of focal points inside a photoresist. The high laser intensity at each focal point triggers a two-photon or multi-photon photopolymerization process that crosslinks the monomers in the vicinity of the focal points. By moving a substrate inside, or covered by, the photoresist with respect to the focal points, identical 3D structures can be fabricated simultaneously in parallel, by photopolymerization at each focal point. This produces a connected or disconnected periodic array of structures. In this fashion, the metalens of the present disclosure may parallelize two-photon lithography by printing large numbers (e.g., tens of thousands, millions or more) of identical structures simultaneously. The novel designs of the various metalens array embodiments disclosed herein may enable the metalens array to interface with the photoresist directly (i.e., requiring no additional objective for focusing), and even further improve the printing resolution and quality of a 3D printed part. Machine learning algorithms may be used for inverse design of the specific nanoscale feature structure arrangement in the metalens array. Static or dynamic masks can be used in conjunction with a given metalens array of the present disclosure to block part of the metalens array, and thus constrain the printing area into specific shapes. Various embodiments of the invention can contain modifications of the metalens array to include non-periodicity or to take advantage of a spatial light modulator to individually control each focal point dynamically to enable 3D printing of complex, non-periodic geometries. Post-processing treatments can be used to convert the 3D-printed polymer structures into ceramic, metallic, carbon or hybrid structures.

Figure 1:
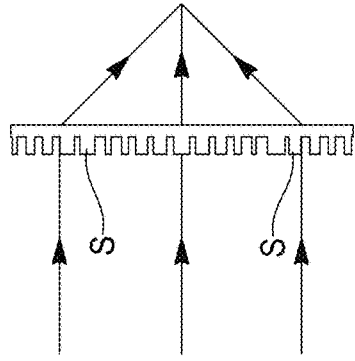
FIG. 1 is a simplified cross sectional side view of a prior art parabolic lens which may be used for beam focusing.
Figure 2:
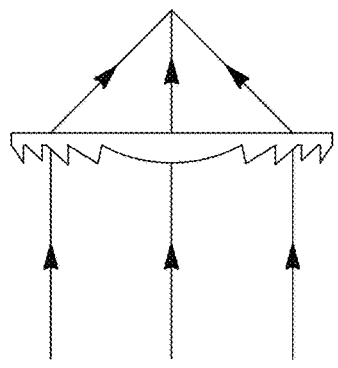
FIG. 2 is a simplified side view of a prior art Fresnel lens which may be used for beam focusing.
Figure 3:
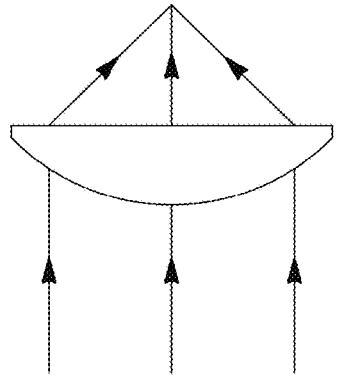
FIG. 3 is a simplified side view of a prior art metalens which may be used for beam focusing.

It will be appreciated then that metasurfaces are surfaces or other arrangements of subwavelength-spaced optical scatterers (i.e., "nanostructured scatterers") that are capable of locally shifting the phase of incident light, and thus shape its wavefront, based on the spatial distribution and geometry of its nanostructured scatterers. A metalens refers to a metasurface that has the same functionality as a conventional lens, such as shown in FIG. 1, or a Fresnel lens, such as shown in FIG. 2, that focuses or disperses a light beam. A single metalens is shown in FIG. 3. The nanostructured scatterers are designated with the letter "S" in FIG. 3.

Figure 4:
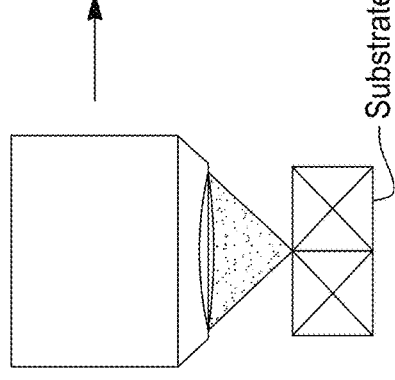
FIG. 4 is simplified cross sectional side view of a prior art objective focusing a beam down to a single focal point on a surface of a substrate.
Figure 5:
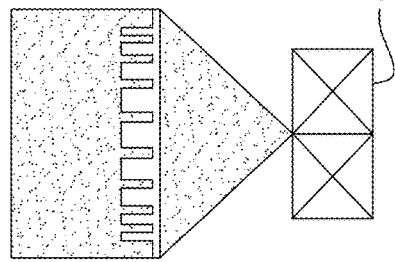
FIG. 5 is a simplified cross sectional side view of a single metalens focusing a beam down to a single focal voxel on a surface of a substrate.

One key advantage of metasurfaces is that they are compatible with photolithography-based microfabrication infrastructure, which advantageously makes it possible to fabricate a large array of metalenses on the same integrated device. One embodiment of the present disclosure forms a metalens array 10 as shown in FIG. 6. The metalens array 10 is able to split an incident laser beam 12 into an array of focal points, which may be understood as "focal voxels" 14 (i.e., focused light points) in a 3D space. This differs from conventional approaches where one focal voxel can be created for use in serial two-photon lithography using a conventional objective, as illustrated in FIG. 4.

Figure 6A:
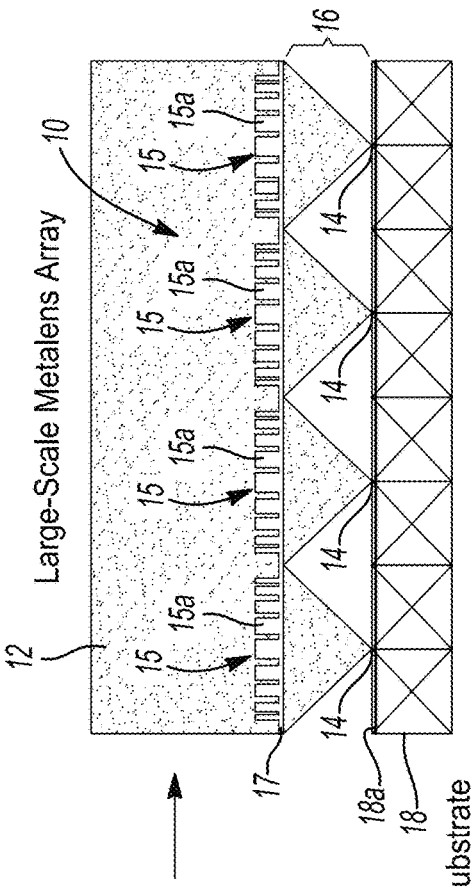
FIG. 6a is a simplified cross sectional side view of one embodiment of a metalens array in accordance with the present disclosure being used to focus a beam down to a plurality of focal voxels on a surface of a substrate.
Figure 6B:
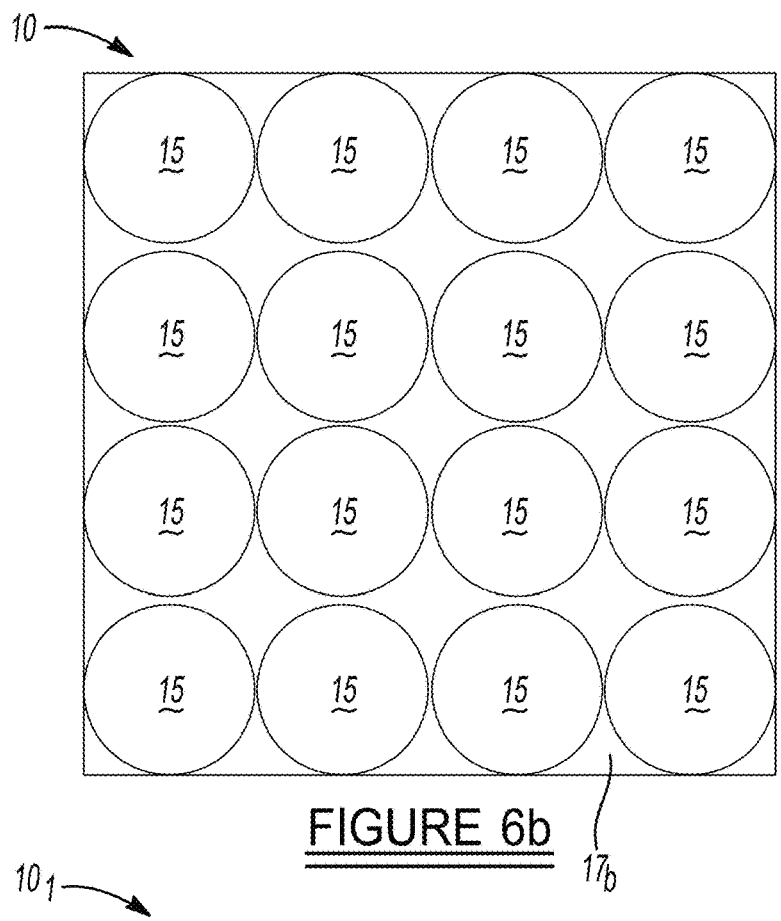
FIG. 6b is a plan view of the embodiment of the metalens array shown in FIG. 6, which forms a 4×4 grid of contiguous, circular metalens unit cells.
Figure 6C:
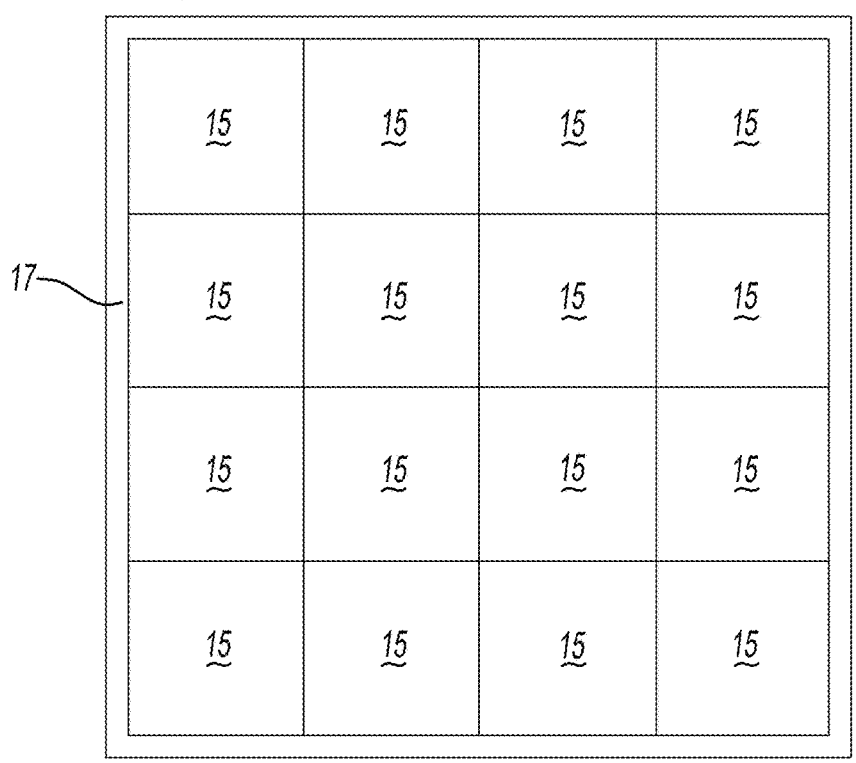
FIG. 6c is a plan view of another embodiment of the metalens array, but where square shaped unit cells are used to form the X/Y grid of cells.

FIG. 6a shows one example of an embodiment of the metalens array 10 incorporating a plurality of metalens unit cells 15, each including a plurality of nanoscale features 15a. The metalens unit cells 15 in this example are positioned generally contiguous with one another to create four focal voxels 14 (i.e., 3D focal points) from the incoming laser beam 12. FIG. 6b shows a plan view of the metal lens array 10, in which the unit cells 15 can be seen as circular cells arranged to form a 4×4 contiguous grid of unit cells. FIG. 6c shows another embodiment 101 in which the unit cells 15 are formed as squares and arranged contiguously with one another in an X-Y grid pattern. While the metalens array 10 of FIG. 6a is shown incorporating only four metalens unit cells 15 and 16 in each of FIGS. 6b and 6c), this is merely for illustrative purposes, and in practice the metalens array 10 will more typically include a much greater number of metalens unit cells. It is anticipated that in many applications, metalens arrays having hundreds, thousands, tens of thousands or more unit cells 15 may be preferable, especially for applications such as two-photon lithography 3D printing applications. And while the metalens unit cells 15 are shown being circular in shape in FIG. 6b and square in shape in FIG. 6c, they could be formed in virtually any other shape or geometric configuration (e.g., and without limitation, pentagons, hexagons, octagons, triangles, rectangles, etc., as well as combinations of the any of the above shapes, in a fully contiguous or near-contiguous pattern). The outer perimeter shape of the metalens array 10 also may take virtually any shape (e.g., and without limitation, square, rectangular, triangular, circular, diamond, octagonal, pentagonal, hexagonal, trapezoidal, etc.) The metalens unit cells 15 in FIG. 6a-6c are formed on a common, planar substrate member 17, and shown in the example of FIG. 6c as being just slightly larger than the area encompassed by the sixteen metalens unit cells 15, simply to help with illustration of this component.

By relative movement between a substrate 18 loaded with a photoresist 18a and the metalens array 10, the large array of focused focal voxels 14 created by the metalens array can induce two-photon polymerization of the photoresist simultaneously, and thus print periodic 3D structures in a highly parallel fashion. Such an arrangement may be accomplished, in one example, by positioning the substrate 18 at a desired depth within a resin bath filled with the photoresist 18a, and then moving one or the other of the substrate or the metalens array 10 as needed to carry out the two-photon polymerization printing process. In this example the photoresist 18a will be resting within the focal plane, and thus the focal plane will form a flat plane where portions of the photoresist are activated simultaneously using the plurality of simultaneously projected focal voxels 14.

With the metalens array 10, the geometric information within a repeating unit of a periodic structure is encoded by each focal voxel 14 through the relative motion of the substrate 18 to the metalens array 10 (i.e. through "Direct Laser Writing"). The metalens array 10 prescribes how the repeating metalens unit cells 15 are repeated in the lateral plane (i.e., the X-Y plane) by the spatial arrangement of the metalens unit cells within the array 10. This unique combination of "Direct Laser Writing" using a motion stage and structure replication using the metalens array 10 enhances the generality of the printable geometries and differentiates the current invention from holographic pattern generation approaches in which only specific, pre-designed structures can be made.

When implementing metalens-based two-photon lithography with the metalens array 10, a mask-based approach similar to photolithography-based microfabrication may be adopted. In the semiconductor industry, complex and highly integrated processors are manufactured through a series of mask-based lithography processes, in which custom-made masks store all the geometric and compositional information of each processor design. Even though these masks are expensive to fabricate, the high degree of integration and the large volume of production make this method economical, and it is continuously being improved following Moore's Law. In one embodiment of the current metalens array 10, optimized periodic geometry is first selected for the specific application of the 3D printed micro/nanoscale features. For example and without limitation, the specific application may involve the manufacture of batteries, fuel cells or electrolyzer electrodes, the manufacture of photonic or phononic crystals, the manufacture of mechanical metamaterials, the manufacture of microelectromechanical systems (MEMS), as well as the manufacture of integrated circuit chips, quantum information processors and microfluidic devices. It is expected that further applications for the metalens array 10 will arise in the future.

Based on considerations involving part geometry and other factors, specific embodiments of the metalens array 10 with various focal spot sizes, spatial configurations, areal densities and symmetry groups (e.g., square, circular, hexagonal, etc.) may be constructed as illustrated in FIGS. 7a-7e. FIG. 7e shows how even specific focal voxels 15" within a given metalens array may be of a different size than other ones of the focal voxels 15.

Such metalens arrays 10 with the nanoscale features 15a and metalens unit cell 15 forming focal voxel 14 arranged in selective spatial patterns effectively function as masks that enable a given metalens array 10 to store the information of how a metalens unit cell 15 is repeated within the desired periodic structure, while the geometric information within the unit cell 15 is encoded by controlled substrate motion (i.e., "Direct Laser Writing"). Higher order variations of the construction of each metalens unit 15, or the X-Y configuration of the metalens unit cells 15 on a given metalens array 10, can also be prescribed during fabrication of the metalens array 10 so that specific focal spots can be expanded, reduced, or even eliminated. In this manner, the number of degrees of freedom that can be engineered within a given one of the metalens arrays 10 is nearly limitless. Various embodiments of the metalens array 10 may also take advantage of more complex metasurface design (e.g. 3D holography, polarization control, stimulated emission depletion), in combination with substrate stage motion, to achieve parallel, high throughput two-photon 3D printing with sub-micron resolution.

To tailor the overall size and shape of the 3D printed micro/nano-structures, as well as the nanoscale features 15a for specific applications, one or more additional layers of macroscopic light-blocking mask can be used to limit the area of two-photon polymerization as shown in FIGS. 8-12. Examples of such masks are shown as components 17a-17d in FIGS. 8-11, and a mask assembly 17e in FIG. 12. A dynamically tunable macroscopic mask such as a spatial light modulator could be used to define the exterior shape of the 3D printed structure at a larger length scale, while the internal micro/nano-structures are imparted through relative movement between the metalens array 10 and the substrate 18. One embodiment of the metalens array 10 can also pair each pixel of a spatial light modulator to each individual metalens unit cell 15 in the metalens array 10 so that each focal spot can be turned on and off or modulated in intensity dynamically during printing. In this way, complex, non-periodic 3D structures or shapes can be produced highly efficiently by utilizing a subset of the focal voxels 14 dynamically after carefully planning the writing path and the focal point array modulation, based on the desired geometry using advanced algorithms. After 3D printing, post-processing treatments such as pyrolysis, electrodeposition or physical/chemical vapor deposition may even also be used to convert the polymer structures into ceramic, metallic, carbon or other forms of hybrid structures.

A key difference between the present disclosure and previously demonstrated serial, projection or multi-focal two-photon lithography techniques is replacing the high NA objective with an embodiment of the metalens array 10, which interfaces with the photoresist directly. A high NA objective generally has a field of view of only a few hundred microns, so stitching is necessary when printing any structure larger than the field of view (which is the case with many, if not most, 3D printed structures/parts). This limitation not only significantly reduces the printing speed but also compromises the printing quality due to inevitable stitching errors. Stitching errors are especially common when 3D printing large structures at the centimeter scale, which may be composed of tens of thousands of individual prints that are stitched together. On the other hand, the metalens array 10 of the present disclosure can be fabricated at the wafer scale using existing microfabrication infrastructure. Therefore a large metalens array 10 can produce millions or more focused voxels and thus enable large-scale parallel 3D printing, which may be used to create structures at the centimeter scale highly efficiently and accurately without stitching.

One challenge of using the metalens array 10 to parallelize two-photon 3D printing is the shape and the aspect ratio of the voxels 14 (i.e., focal points) which is constrained by the numerical aperture of the metalens design. The focal voxel of a laser beam for two-photon absorption processes is generally in an ellipsoid shape that is elongated in the axial direction, i.e., the direction of the laser beam propagation (defined as the Z direction). The aspect ratio of a voxel is the ratio of its height in the axial direction to its width in the radial direction (e.g., in one example the ratio of its length in the Z axis with respect to its lengths in the X and Y axes). A small aspect ratio that is closer to 1:1, which at the present time is very difficult to achieve in practice, indicates a more evenly confined focal voxel in the radial and the axial directions which produces even better printing quality. The aspect ratio of a focal voxel is inversely proportional to the numerical aperture of the lens design. However, a high numerical aperture also leads to a short focal distance given the small size of each metalens unit cell 15 in the metalens array 10, which poses engineering challenges to the mechanical motion system used to position the substrate 18 accurately at the focal plane, and to move the substrate in highly precise X-Y movements in the focal plane during printing. It will also be appreciated that when reference herein is made to "two photon printing", that the two photon printing operation does not have to be a strict layer-by-layer process. During two photon printing, one can move the focal spots along each of the X, Y and Z axes, relative to the substrate, simultaneously. So this process would be similar to using a pen tip to draw in 3D; in other words, the drawing does not need to be limited to be a 2D plane. As another example, if movement occurs in the X axis, then one may be drawing a lateral line on the substrate. But if movement occurs in the Z axis, i.e., by pulling the substrate away from the focal spot, then one may draw a vertical line (pillar) perpendicular to the substrate.

It should also be appreciated that it is important to maintain a sufficiently large focal distance between the metalens array 10 and the printing substrate 18. However, this has the negative effect of limiting the feasible numerical aperture of the metalens design.

One embodiment of the metalens array 10 disclosed herein may use the design freedom that the metalens array provides to improve the shape of the focal voxels 14. For example, instead of adopting a parabolic phase profile for each metalens unit cell 15, a "crossover" lens design can be created by engineering crosstalk between neighboring metalens unit cells into the design of the metalens array 10. The engineered crosstalk operates to reduce the focal voxel size, and well as to reduce the aspect ratio (i.e., bring the aspect ratio closer to 1:1), while maintaining the same focal distance and the same spacing between focal voxel (i.e., focal points). In some embodiments, the metalens array 10 with the crossover lens design discussed herein can reduce the aspect ratio of the focal voxels to about 5:1, and in some embodiments even further, down to about 3:1 or even slighter closer to 1:1.

The reduction in the aspect ratio down to closer to 1:1 is illustrated in FIG. 14a. In this 1D implementation of the metalens array 10', the two metalens unit cells 15 do not each work to focus light to a central focal spot on a focal plane 50 at a central location with their respective unit cells (as with the conventional parabolic lens design of FIG. 13a). Instead, the nanoscale features 15a of each metalens unit cell 15 in FIG. 14a operate as nanoscale feature light scatters which efficiently scatter light in a desired direction and with a desired phase. This action modifies the phase of the wavefront of the optical beam so that the wavefront is focused to create two intersecting (i.e., overlapping) focal points (i.e., focal voxels) at its adjacent, neighboring metalens unit cells, and more specifically at its opposite lateral edges or sides (i.e., in this example at its opposite lateral boundaries).

In general, there are two methods to implement the metalens design (i.e., convert the desired phase profile to actual nanoscale features) as described above and shown in FIG. 14a. The first involves a library-based approach based on a periodic arrangement of similar structures with varying parameters. One specific example is a periodic Si nanoscale pillar array with varying pillar diameters. U.S. Pat. No. 9,507,064 B2 "Dielectric metasurface optical elements", U.S. patent Ser. No. 10/408,419 B2, "Lighting device including a collimating metalens" and WO 2017/176921 A1, "Meta-lenses for sub-wavelength resolution imaging", all involve this method. The teachings of these disclosures are all hereby incorporated by reference into the present application. One may term this approach a "library-based" approach because one first calculates what phase can be added with nanoscale pillars of certain diameters, and this is used to construct a data base/library of information correlating nanoscale pillar diameters that may achieve specific phase modifications. When designing the actual phase profile of a metalens array, one just selects the needed information from the data base/library to achieve the needed phase profile. But this approach may be challenging when designing a metalens on such a small scale as discussed in the present disclosure.

The second method for implementing the metalens array design shown in FIG. 14a is by using a machine learning based optimization process. This technique uses a computer to generate complex geometry that is not periodic, but produces the desired phase profile. Additional details explaining this approach to the manufacture of a metalens with engineered light scatting and phase control may be found in T. Fan et al., "High-efficiency, large area topology-optimized metasurfaces," Light: Sciences & Applications, 8, 48 (2019); and J. Jiang et al., "Global Optimization of dielectric metasurfaces using a physics-driven neural network," Nano Letters, 19(8), 5366 (2019), both of the disclosures of which are hereby incorporated by reference into the present application.

Thus, in the embodiment shown in FIG. 14b, the top metalens unit cell 15 focuses light to focal points (i.e., creating focal voxels) $15_1$ and $15_1$ at its lateral boundaries, and the lower metalens unit 15 focuses light to focal point $15_1$ and also to focal point $15_2$, at its lateral boundaries. Alternatively, each of the metalens unit cells 15 can be constructed such that a plurality of focal voxels are created at or near the lateral edges of each metalens unit cell, such that multiple focal voxels overlap one another at or near lateral edges of adjacent pairs of the metalens unit cells. Still further, the metalens unit cells 15 can be designed to modify the wavefront of a beam incident on all or some of the metalens unit cells so that overlapping focal voxels are created at one or both of: interior areas of each metalens unit cell; or at lateral boundary locations of adjacently positioned metalens unit cells. Thus, the overlapping of specific focal points/voxels does not have to happen at the lateral boundaries of each unit cell 15. For example, one may design the metalens array 10 so that crosstalk is selectively introduced, for example between 9 metalens unit cells 15, where the focal spot is at the center of some of the 9 metalens units cells, while the focal spot is located at one or more other areas within other ones of the metalens unit cells. As such, the overlapping of two or more metalens unit cells 15 in this example would not be at the lateral boundaries of two unit cells.

Simulations of intensity using a selected phase profile as the input demonstrate that such a crossover metalens array 10 design can effectively reduce the size and the aspect ratio of the focal voxel 14. This is illustrated in the intensity simulations of FIGS. 13b and 14b. FIG. 13b shows the length of the spot "SP" along the Z axis, where FIG. 14b shows the significantly reduced length of the focal voxel 15' along the Z axis. FIGS. 13c1-13c3 and 14c1-14c3 show graphs which help to illustrate the differences in intensity seen in the above described simulations between the conventional parabolic lens design of FIG. 13a and the crossover metalens array 10' of FIG. 14a, as a result of controlling the phase profile with the crossover metalens array 10' design.

Such array designs as shown for the metalens array 10' in FIG. 14a, with intentional crosstalk engineered into the metalens unit cells 15 of the metalens array 10, can be implemented in a 2D metalens array to improve, as well as selectively modify, the focal voxel shape, and thus improve the printing quality, possibly allowing even smaller features to be printed that would be difficult or impossible without the crosstalk created within the metalens array.

The engineered crosstalk feature is explained with reference to FIGS. 15a and 16a. FIG. 15a shows phase profiles across the size of the metalens unit cells 15a as the input for the simulation. FIG. 15b, as well as FIGS. 16b and 16c, are the resulting intensity profiles of the focal spots which determine the focal voxel size/aspect ratio. The size of each of the focal voxels 15' shown in FIGS. 16b1 and 16b2 is significantly smaller than the focal voxel FV shown in FIGS. 15b1 and 15b2. This is further illustrated in the intensity simulations of FIGS. 16b1 and 16b2 which show the shape of the focal voxel 15' in the X-Z plane and Y-Z plane. Note the significantly shorter lengths in Z in FIGS. 16b1 and 16b2 versus the lengths of the focal voxel FV in FIGS. 15b1 and 15b2. FIGS. 16c1 and 16c2 are the resulting intensity profiles along and X and the Y axis at the focal distance in Z, and FIG. 16c3 shows a simulated intensity distribution in the X-Y plane of the focal voxel 15' at the focal distance in Z.

With brief reference to FIGS. 17a-17c, illustrations are shown explaining how pairing of each metalens unit cell with a pixel in a spatial light modulator enables 3D printing of periodic structures with defined exterior boundary and non-periodic structures. FIG. 17a shows the incoming laser beam 12 irradiating the metalens array 10 such that all of the metalens unit cells 15 are irradiated, which allows focal voxels 14 to be produced from each metalens unit cell 15, to simultaneously form a plurality of areas of a uniformly periodic structure. FIG. 17b shows mask elements 100 present in the path of the incoming laser beam 12, which blocks portions of the beam from reaching selected ones of the metalens unit cells 15, and thus prevents focal voxels 14 from being created to form portions of a structure, resulting in a non-periodic structure. FIG. 17 shows a similar example where a mask 102 is used so that the laser beam 12 is only allowed to pass through a plurality of parallel curvilinear openings 104 in the mask. The curvilinear openings 104 thus define what portions of the metalens array 10 are able to receive optical energy from the laser beam 12. In this manner the metalens array 10 is used to simultaneously form a plurality of curvilinear structures 106.

The systems and methods relating to the metalens array 10 disclosed herein can enable the fabrication of 3D structures with small feature size and large total volume, which can be used in a wide variety of applications. Such applications may include, without limitation, the manufacture of battery, fuel cell and electrolyzer electrodes, the manufacture of photonic or phononic crystals, the manufacture of mechanical metamaterials, microelectromechanical systems (MEMS), integrated circuit chips, as well as quantum information processors and microfluidic devices. While the various embodiments of the metalens array 10 described herein are especially well suited for use in two-photon photolithography 3D printing applications, it will be appreciated that the present disclosure is not limited to such applications. It is expected that the various embodiments of the metalens array 10 and/or 10' may be used in systems which perform 2D patterning by single photon or two photon photopolymerization or ablation, or in use as an optical tweezer array to control a large array of small objects, for example cells or particles, in set positions.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A metalens array apparatus for controllably modifying a wavefront of an optical beam, the apparatus comprising:
    a first metalens unit cell having a first plurality of nanoscale features, the first metalens unit cell configured to modify a first portion of a wavefront of an optical signal in accordance with a first predetermined phase pattern to create a first focal voxel within an image plane;

a second metalens unit cell having a second plurality of nanoscale features and formed adjacent to the first metalens unit cell, the second metalens unit cell configured to receive and modify a second portion of the wavefront of the optical signal, and in accordance with a second predetermined phase pattern, to create a second focal voxel within the image plane; and wherein the first and second metalens unit cells are further configured to simultaneously receive portions of the optical beam to enable simultaneously projecting the first and second focal voxels within the image plane.

2. The apparatus of claim 1, wherein the first and second metalens unit cells are identical in construction.

3. The apparatus of claim 1, wherein the first and second metalens unit cells are different in construction.

4. The apparatus of claim 1, wherein the first and second pluralities of nanoscale of the first and second metalens unit cells, respectively, create the first and second focal voxels with different dimensions.

5. The apparatus of claim 1, wherein the first and second pluralities of nanostructures of the first and second metalens unit cells, respectively, create the first and second focal voxels with the same dimensions.

6. The metalens array of claim 1, wherein the first focal voxel and the second focal voxel at least partially overlap one another at a point in the image plane to produce a resulting focal voxel, and wherein the resulting focal voxel differs in at least one aspect from the focal voxel and the second focal voxel.

7. The metalens array of claim 6, wherein the at least one aspect comprises a dimension.

8. The metalens array of claim 6, wherein the at least one aspect comprises an aspect ratio.

9. The metalens array of claim 8, wherein the aspect ratio comprises an aspect ratio of at least about 5:1.

10. The metalens array of claim 6, wherein the first focal voxel and the second focal voxel fully overlap one another in the image plane to form a resulting focal voxel which differs in at least one respect from each of the first focal voxel and the second focal voxel.

11. The metalens array of claim 10, wherein the at least one aspect comprises a dimension.

12. The metalens array of claim 10, wherein the at least one aspect comprises an aspect ratio.

13. The metalens array of claim 12, wherein the metalens array forms a numerical aperture of 0.8 or greater.

14. A metalens array for use in two-photon lithography, for controllably modifying a wavefront of an optical beam being used to activate a photoresist, the photoresist being used to form a 3D part in a printing operation, the apparatus comprising:

a substrate;

a plurality of metalens unit cells arranged in a contiguous planar grid on the substrate, each said metalens unit cell including:

a plurality of nanoscale features formed on the substrate, which modify a portion of a wavefront of the optical beam which is incident upon an upper surface of the metalens array in a predetermined manner to generate at least one focal voxel within an area defined by its associated said metalens unit cell, and further such that the at least one focal voxel is generated within a planar focal plane within which the photoresist is present, and wherein the metalens unit cells create their respective focal voxels simultaneously within the focal plane using the optical beam.

15. The metalens array of claim 14, wherein the nanoscale features of the metalens unit cells are different in construction, such that select ones of the focal voxels differ in at least one aspect from one another.

16. The metalens array of claim 14, wherein the selected ones of the focal voxels differ in at least one of:

dimension;

spatial location relative to their respective said metalens unit cell; or aspect ratio.

17. The metalens array of claim 14, wherein each said metalens unit cell creates two focal voxels at spaced apart locations within the focal plane.

18. The metalens array of claim 17, wherein select ones of the focal voxels at least partially overlap one another in the focal plane, such that each said focal voxel is formed using portions of the optical beam passing through two adjacently positioned metalens unit cells.

19. A method of forming a metalens array able to controllably modify a wavefront of an optical beam incident thereon, the method comprising:

forming a plurality of unit cells on a portion of a planar substrate material, which collectively configure the metalens array to form a periodic structure;

further forming each one of the plurality of unit cells such that the unit cells are arranged contiguously to one another in a grid pattern; and further forming each one of the plurality of unit cells such that each is able to modify a portion of the wavefront of the optical beam, and such that each said unit cell simultaneously creates a focal voxel within an image plane.

20. The method of claim 19, further comprising forming the unit cells such that each said unit cell simultaneously creates two spaced apart focal voxels within the image plane, and further such that adjacently located ones of the unit cells produce overlapping focal voxels within the image plane.

* * * * *